United States Patent
Shida

(10) Patent No.: US 10,956,067 B2
(45) Date of Patent: Mar. 23, 2021

(54) MEMORY CONTROLLER AND FLASH MEMORY SYSTEM HAVING THE SAME

(71) Applicant: TDK Corporation, Tokyo (JP)

(72) Inventor: Kazuo Shida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/687,189

(22) Filed: Nov. 18, 2019

(65) Prior Publication Data
US 2020/0159428 A1 May 21, 2020

(30) Foreign Application Priority Data
Nov. 21, 2018 (JP) .............................. JP2018-217908

(51) Int. Cl.
| | | |
|---|---|---|
| *G11C 7/02* | (2006.01) | |
| *G06F 3/06* | (2006.01) | |
| *G11C 11/56* | (2006.01) | |

(52) U.S. Cl.
CPC .......... *G06F 3/0634* (2013.01); *G06F 3/0616* (2013.01); *G06F 3/0679* (2013.01); *G11C 11/5628* (2013.01)

(58) Field of Classification Search
CPC .. G06F 3/0616; G06F 3/0679; G11C 11/5628
See application file for complete search history.

(56) References Cited

U.S. PATENT DOCUMENTS

| | | | | |
|---|---|---|---|---|
| 8,553,457 B2 * | 10/2013 | Kim | .................... | G06F 12/0246 |
| | | | | 365/185.03 |
| 2014/0304451 A1 * | 10/2014 | Shibayama | ........... | G06F 3/0644 |
| | | | | 711/103 |
| 2015/0127886 A1 * | 5/2015 | Kanno | ................ | G06F 12/0246 |
| | | | | 711/103 |
| 2018/0211708 A1 * | 7/2018 | Igahara | ................. | G06F 3/0679 |

FOREIGN PATENT DOCUMENTS

| JP | 2017-224112 A | 12/2017 |
|---|---|---|
| JP | 2017-228010 A | 12/2017 |

* cited by examiner

*Primary Examiner* — Tuan T Nguyen
(74) *Attorney, Agent, or Firm* — McDermott Will & Emery LLP

(57) ABSTRACT

Disclosed herein is a memory controller controlling data transfer between a host system and a flash memory. The memory controller is configured to operate on one of a plurality of operation states including first and second operation states. In the first operation state, a first memory area included in the flash memory is used in a first storage mode that stores information of less than n bits in one cell, and a second memory area included in the flash memory is used in a second storage mode that stores information of n bits or more in one cell. In the second operation state, the first memory area is used in the second storage mode, and the second memory area is used in the first storage mode.

5 Claims, 15 Drawing Sheets

| | STORAGE MODE | REWRITING FREQUENCY | |
|---|---|---|---|
| | | pSLC | MLC |
| 0 | pSLC | 98 | 0 | ← 40
| 1 | pSLC | 90 | 0 | ← 40
| 2 | pSLC | 95 | 0 | ← 40
| 3 | pSLC | 93 | 0 |
| 4 | pSLC | 95 | 0 |
| ⋮ | ⋮ | ⋮ | ⋮ |
| 95 | pSLC | 92 | 0 |
| 96 | pSLC | 97 | 0 |
| 97 | pSLC | 96 | 0 |
| 98 | pSLC | 90 | 0 |
| 99 | pSLC | 91 | 0 |
| 100 | MLC | 0 | 20 |
| 101 | MLC | 0 | 21 |
| 102 | MLC | 0 | 22 |
| 103 | MLC | 0 | 17 |
| 104 | MLC | 0 | 22 |
| 105 | MLC | 0 | 16 |
| 106 | MLC | 0 | 18 |
| ⋮ | ⋮ | ⋮ | ⋮ |
| 993 | MLC | 0 | 24 |
| 994 | MLC | 0 | 18 |
| 995 | MLC | 0 | 20 |
| 996 | MLC | 0 | 22 |
| 997 | MLC | 0 | 18 |
| 998 | MLC | 0 | 23 |
| 999 | MLC | 0 | 17 |

| | STORAGE MODE | REWRITING FREQUENCY | |
|---|---|---|---|
| | | pSLC | MLC |
| 0 | MLC | 100 | 1 |
| 1 | pSLC | 95 | 0 |
| 2 | pSLC | 98 | 0 |
| 3 | pSLC | 95 | 0 |
| 4 | pSLC | 98 | 0 |
| ... | ... | ... | ... |
| 95 | pSLC | 95 | 0 |
| 96 | MLC | 100 | 1 |
| 97 | MLC | 100 | 1 |
| 98 | pSLC | 94 | 0 |
| 99 | pSLC | 95 | 0 |
| 100 | pSLC | 1 | 20 |
| 101 | pSLC | 1 | 21 |
| 102 | pSLC | 1 | 22 |
| 103 | MLC | 0 | 20 |
| 104 | MLC | 0 | 22 |
| 105 | MLC | 0 | 20 |
| 106 | MLC | 0 | 21 |
| ... | ... | ... | ... |
| 993 | MLC | 0 | 24 |
| 994 | MLC | 0 | 20 |
| 995 | MLC | 0 | 20 |
| 996 | MLC | 0 | 22 |
| 997 | MLC | 0 | 20 |
| 998 | MLC | 0 | 23 |
| 999 | MLC | 0 | 20 |

FIG. 6A

| | STORAGE MODE | REWRITING FREQUENCY | |
|---|---|---|---|
| | | pSLC | MLC |
| 0 | MLC | 100 | 2 |
| 1 | pSLC | 98 | 0 |
| 2 | MLC | 100 | 1 |
| 3 | pSLC | 99 | 0 |
| 4 | MLC | 100 | 1 |
| ... | ... | ... | ... |
| 95 | pSLC | 95 | 0 |
| 96 | MLC | 100 | 2 |
| 97 | MLC | 100 | 2 |
| 98 | pSLC | 97 | 0 |
| 99 | MLC | 100 | 1 |
| 100 | pSLC | 3 | 20 |
| 101 | pSLC | 3 | 21 |
| 102 | pSLC | 4 | 22 |
| 103 | pSLC | 1 | 23 |
| 104 | pSLC | 1 | 25 |
| 105 | pSLC | 1 | 23 |
| 106 | MLC | 0 | 24 |
| ... | ... | ... | ... |
| 993 | MLC | 0 | 29 |
| 994 | MLC | 0 | 28 |
| 995 | MLC | 0 | 27 |
| 996 | MLC | 0 | 23 |
| 997 | MLC | 0 | 23 |
| 998 | MLC | 0 | 30 |
| 999 | MLC | 0 | 25 |

FIG. 6B

| | STORAGE MODE | REWRITING FREQUENCY | |
|---|---|---|---|
| | | pSLC | MLC |
| 0 | MLC | 100 | 3 |
| 1 | MLC | 100 | 1 |
| 2 | MLC | 100 | 2 |
| 3 | MLC | 100 | 1 |
| 4 | MLC | 100 | 2 |
| ... | ... | ... | ... |
| 95 | MLC | 100 | 1 |
| 96 | MLC | 100 | 3 |
| 97 | MLC | 100 | 3 |
| 98 | MLC | 100 | 1 |
| 99 | MLC | 100 | 1 |
| 100 | pSLC | 5 | 20 |
| 101 | pSLC | 5 | 21 |
| 102 | pSLC | 3 | 22 |
| 103 | pSLC | 3 | 23 |
| 104 | pSLC | 3 | 25 |
| 105 | pSLC | 3 | 23 |
| 106 | pSLC | 1 | 32 |
| ... | ... | ... | ... |
| 993 | MLC | 0 | 41 |
| 994 | MLC | 0 | 29 |
| 995 | MLC | 0 | 36 |
| 996 | MLC | 0 | 28 |
| 997 | MLC | 0 | 30 |
| 998 | MLC | 0 | 45 |
| 999 | MLC | 0 | 31 |

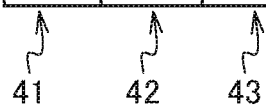

| | | |
|---|---|---|
| 0 | MLC | ⌐32 |
| 1 | pSLC | |
| 2 | pSLC | |
| 3 | pSLC | |
| 4 | pSLC | ⎫31 |
| ⋮ | ⋮ | |
| 95 | pSLC | |
| 96 | MLC | ⎫32 |
| 97 | MLC | |
| 98 | pSLC | |
| 99 | pSLC | |
| 100 | pSLC | |
| 101 | pSLC | ⎫31 |
| 102 | pSLC | |
| 103 | MLC | |
| 104 | MLC | |
| 105 | MLC | |
| 106 | MLC | |
| ⋮ | ⋮ | |
| 993 | MLC | ⎫32 |
| 994 | MLC | |
| 995 | MLC | |
| 996 | MLC | |
| 997 | MLC | |
| 998 | MLC | |
| 999 | MLC | |

FIG. 7B

| | | |
|---|---|---|
| 0 | MLC | ⌐32 |
| 1 | pSLC | ⌐31 |
| 2 | MLC | ⌐32 |
| 3 | pSLC | ⌐31 |
| 4 | MLC | ⌐32 |
| ⋮ | ⋮ | ⎫31 |
| 95 | pSLC | |
| 96 | MLC | ⎫32 |
| 97 | MLC | |
| 98 | pSLC | ⌐31 |
| 99 | MLC | ⌐32 |
| 100 | pSLC | |
| 101 | pSLC | |
| 102 | pSLC | |
| 103 | pSLC | ⎫31 |
| 104 | pSLC | |
| 105 | pSLC | |
| 106 | MLC | |
| ⋮ | ⋮ | |
| 993 | MLC | ⎫32 |
| 994 | MLC | |
| 995 | MLC | |
| 996 | MLC | |
| 997 | MLC | |
| 998 | MLC | |
| 999 | MLC | |

FIG. 7C

| | | |
|---|---|---|
| 0 | MLC | |
| 1 | MLC | |
| 2 | MLC | |
| 3 | MLC | |
| 4 | MLC | ⎫32 |
| ⋮ | ⋮ | |
| 95 | MLC | |
| 96 | MLC | |
| 97 | MLC | |
| 98 | MLC | |
| 99 | MLC | |
| 100 | pSLC | |
| 101 | pSLC | |
| 102 | pSLC | |
| 103 | pSLC | ⎫31 |
| 104 | pSLC | |
| 105 | pSLC | |
| 106 | pSLC | |
| ⋮ | ⋮ | |
| 993 | MLC | |
| 994 | MLC | |
| 995 | MLC | ⎫32 |
| 996 | MLC | |
| 997 | MLC | |
| 998 | MLC | |
| 999 | MLC | |

| | STORAGE MODE | REWRITING FREQUENCY | |
|---|---|---|---|
| | | pSLC | MLC |
| 0~99 | MLC | 10000 | 10 | ← 40
| 100~199 | pSLC | 0 | 2045 | ← 40
| 200~299 | MLC | 0 | 1977 | ← 40
| 300~399 | MLC | 0 | 2001 |
| 400~499 | MLC | 0 | 2251 |
| 500~599 | MLC | 0 | 2307 |
| 600~699 | MLC | 0 | 2098 |
| 700~799 | MLC | 0 | 2121 |
| 800~899 | MLC | 0 | 2374 |
| 900~999 | MLC | 0 | 2375 |

| | STORAGE MODE | REWRITING FREQUENCY | |
| --- | --- | --- | --- |
| | | pSLC | MLC |
| 0~99 | MLC | 10000 | 5007 |
| 100~199 | MLC | 10000 | 4958 |
| 200~299 | pSLC | 0 | 4210 |
| 300~399 | MLC | 0 | 4830 |
| 400~499 | MLC | 0 | 4894 |
| 500~599 | MLC | 0 | 4662 |
| 600~699 | MLC | 0 | 4099 |
| 700~799 | MLC | 0 | 4242 |
| 800~899 | MLC | 0 | 4701 |
| 900~999 | MLC | 0 | 4315 |

FIG. 12

MEMORY CONTROLLER AND FLASH MEMORY SYSTEM HAVING THE SAME

BACKGROUND OF THE INVENTION

Field of the Invention

The present invention relates to a memory controller and a flash memory system having the memory controller and, more particularly, to a memory controller that makes part of the memory area of a flash memory operate in a pseudo SLC (pSLC) mode or a pseudo MLC (pMLC) mode and a flash memory system using such a memory controller.

Description of Related Art

There are various types of flash memories such as an SLC type that stores one bit of information in one cell, an MLC type that stores two bits of information in one cell, and a TLC type that stores three bits of information in one cell. The SLC-type flash memory has an advantage of high reliability with less bit error and a large number of rewritable times, whereas it has a drawback of high bit unit price. On the other hand, a flash memory of the MLC type or TLC type can store two bits or three bits of data in one memory cell, thus having an advantage of low bit unit price.

JP 2017-224112 A discloses a flash memory system that uses both the SLC-type flash memory and MLC-type flash memory to effectively utilize the characteristics of both the SLC and MLC types. Further, J P 2017-228010 A proposes a method of improving reliability by using the MLC-type flash memory in a pseudo SLC mode when the flash memory system is connected with an auxiliary storage device such as a hard disk drive. As described in JP 2017-228010 A, when the MLC-type flash memory is used in the pseudo SLC mode, its reliability is improved although the memory capacity is reduced.

However, when only part of the memory area of the flash memory is used in the pseudo SLC mode, the following problem occurs. That is, a memory area used in the MLC mode and a memory area used in the pseudo SLC mode differ from each other in the number of rewritable times. For this reason, when one cell type reaches the end of its lifetime, the entire flash memory becomes unusable even the lifetime of the other cell type still remains. Thus, the lifetime of the entire flash memory is shortened. There is an upper limit on the number of rewritable times, and it is known that, in terms of the number of rewritable times, the SLC type is the largest, the MLC type is the second largest, and the TLC type is the smallest.

Such a problem occurs not only when part of the MLC-type flash memory is used in the pseudo SLC mode, but also in all cases where the number of bits to be stored in one memory cell is reduced in part of the memory area of a flash memory, such as when part of the TLC-type flash memory is used in the pseudo SLC mode and when part of the TLC-type flash memory is used in the pseudo MLC mode.

SUMMARY

It is therefore an object of the present invention to use up a flash memory as a whole in a case where part of the memory area of the flash memory is used in a pseudo mode.

A memory controller according to the present invention is a memory controller that controls data transfer between a host system and a flash memory and has: a first operation state in which a first memory area included in the flash memory is used in a first storage mode that stores information of less than n bits in one cell and in which a second memory area included in the flash memory is used in a second storage mode that stores information of n bits or more in one cell; and a second operation state in which the first memory area is used in the second storage mode and in which the second memory area is used in the first storage mode. Further, a flash memory system according to the present invention includes the above memory controller and a flash memory.

According to the present invention, the first and second memory areas are used in the first and second storage modes, respectively, in the first operation state, while in the second operation state, the first and second memory areas are used in the second and first storage modes, respectively, so that wear leveling between cell types is achieved. This prevents only part of the memory area from reaching the end of its lifetime in the early stage, thus making it possible to use up the flash memory as a whole.

In the present invention, when the frequency of rewriting operation with respect to the first memory area satisfies a predetermined condition, the operation state of the memory controller may shift from the first operation state to the second operation state. This allows the first memory area to be switched to the second storage mode before the first memory area reaches the end of its lifetime in the first storage mode.

The memory controller according to the present invention further has a third operation state in which the first and second memory areas are used in the second storage mode and in which a third memory area included in the flash memory is used in the first storage mode. In the first and second operation states, the third memory area included in the flash memory is used in the second storage mode and, when the frequency of rewriting operation with respect to the second memory area satisfies a predetermined condition, the operation state of the memory controller may shift from the second operation state to the third operation state. This allows the second memory area to be returned to the second storage mode before the second memory area reaches the end of its lifetime in the first storage mode.

In the present invention, when a predetermined condition is satisfied after the operation state of the memory controller shifts from the first operation state to another operation state including the second and third operation states, the operation state may shift to the first operation state again. As a result, the storage mode of the first memory area is alternately switched, so that the lifetime in the first storage mode and lifetime in the second storage mode can be used up to approximately the maximum value (e.g., 80% of the maximum value).

In the present invention, the first and second memory areas may each include a single block or a plurality of blocks. In the former case, the lifetime of each block can be maximized. In the latter case, lifetime management by the memory controller can be simplified.

As described above, according to the present invention, it is possible to use up a flash memory as a whole in a case where part of the memory area of the flash memory is used in a pseudo mode.

BRIEF DESCRIPTION OF THE DRAWINGS

The above features and advantages of the present invention will be more apparent from the following description of certain preferred embodiments taken in conjunction with the accompanying drawings, in which:

FIG. 5 is a diagram illustrating an example of the value of the rewriting frequency;

FIGS. 6A to 6C are tables illustrating an example of a change in the value of the control data in the storage mode management part;

FIGS. 7A to 7C are tables illustrating the storage mode of each of the blocks;

FIG. 10 is a diagram illustrating an example of the value of the rewriting frequency;

FIG. 12 is a diagram illustrating another example of the value of the rewriting frequency;

DETAILED DESCRIPTION OF THE EMBODIMENTS

Preferred embodiments of the present invention will be explained below in detail with reference to the accompanying drawings.

Figure 1:
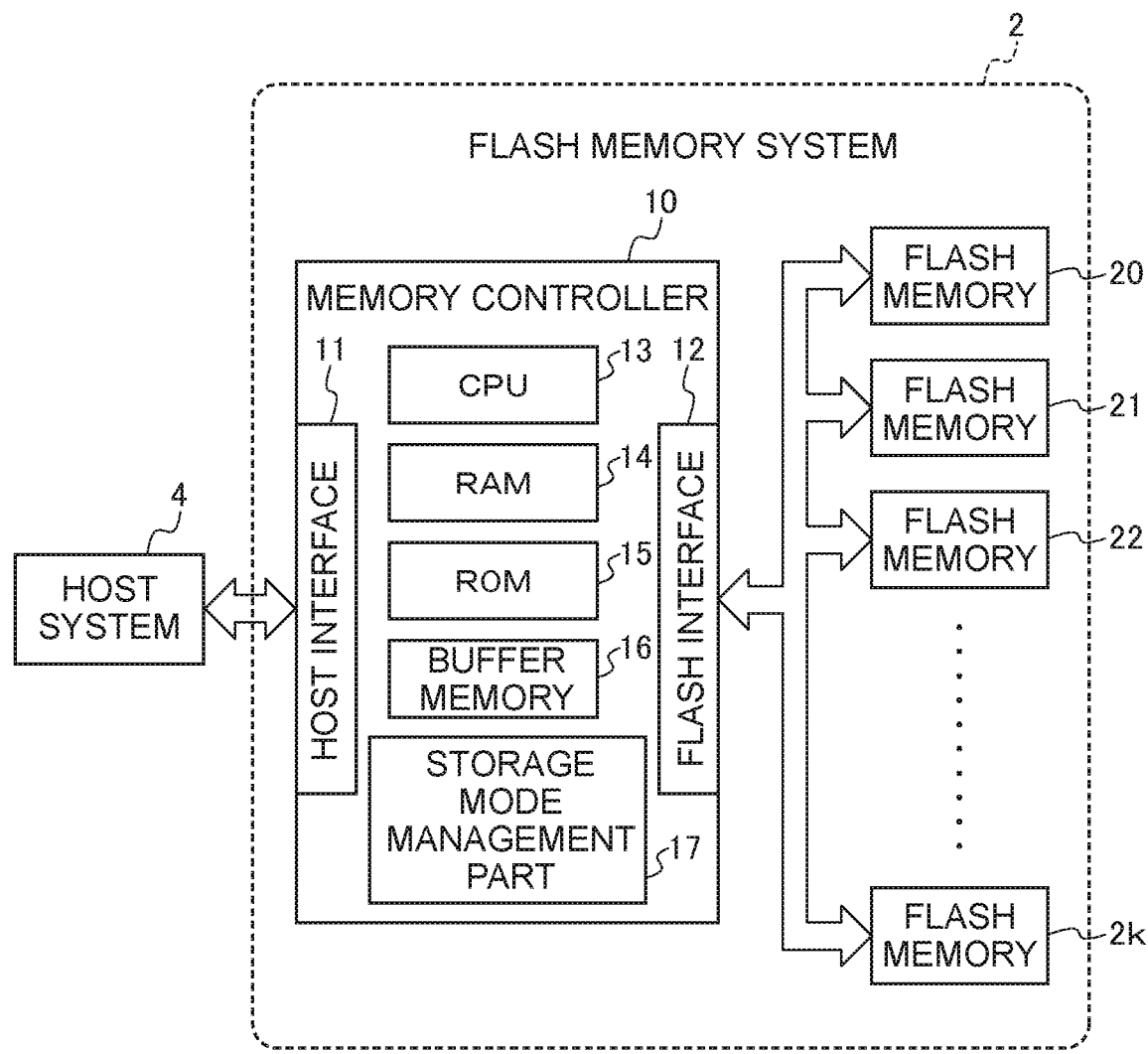
FIG. 1 is a block diagram for explaining the configuration of a flash memory system according to a preferred embodiment of the present invention.

FIG. 1 is a block diagram for explaining the configuration of a flash memory system 2 according to a preferred embodiment of the present invention.

The flash memory system 2 according to the preset embodiment includes a memory controller 10 and a plurality of flash memories 20 to 2 k. Although not particularly limited, the flash memories 20 to 2 k are each a NAND-type flash memory and each constituted of MLC-type memory cells. Although k+1 flash memories 20 to 2 k are mounted in the example of FIG. 1, there is no particular restriction on the number of flash memories to be mounted.

The memory controller 10 is provided between an external host system 4 and flash memories 20 to 2 k and controls data transfer therebetween. Data and commands are exchanged between the host system 4 and the memory controller 10 through a host interface 11, and data and commands are exchanged between the flash memories 20 to 2 k and the memory controller 10 through a flash interface 12.

The memory controller 10 includes a CPU 13, a RAM 14, a ROM 15, a buffer memory 16 and a storage mode management part 17. The CPU 13 controls the entire operation of the memory controller 10 according to a program stored in the ROM 15. The program stored in the ROM 15 may be expanded in the RAM 14 at power-on. The RAM 14 is a work area that temporarily stores data necessary for controlling the flash memories 20 to 2 k and is constituted of a plurality of SRAM cells. The buffer memory 16 is a circuit that temporarily stores read data read out from the flash memories 20 to 2 k and write data to be written in the flash memories 20 to 2 k. Part of the RAM 14 may be used as the buffer memory 16. The write data supplied from the host system is temporarily stored in the buffer memory 16 and then transferred to the flash memories 20 to 2 k through the flash interface 12 after the flash memories 20 to 2 k are brought into a writable state. The read data readout from the flash memories 20 to 2 k is temporarily stored in the buffer memory 16 and then transferred to the host system 4 through the host interface 11 after the host system 4 is brought into a data acceptable state.

The memory controller 10 includes the storage mode management part 17. The storage mode management part 17 is a circuit that specifies a storage mode of each of blocks constituting the flash memories 20 to 2 k and manages the number of rewriting times for each storage mode. The storage mode management part 17 may be a dedicated circuit provided separately from the CPU 13, RAM 14 and ROM 15, or some or all functions thereof may be realized by the CPU 13, RAM 14 or ROM 15.

Figure 2:
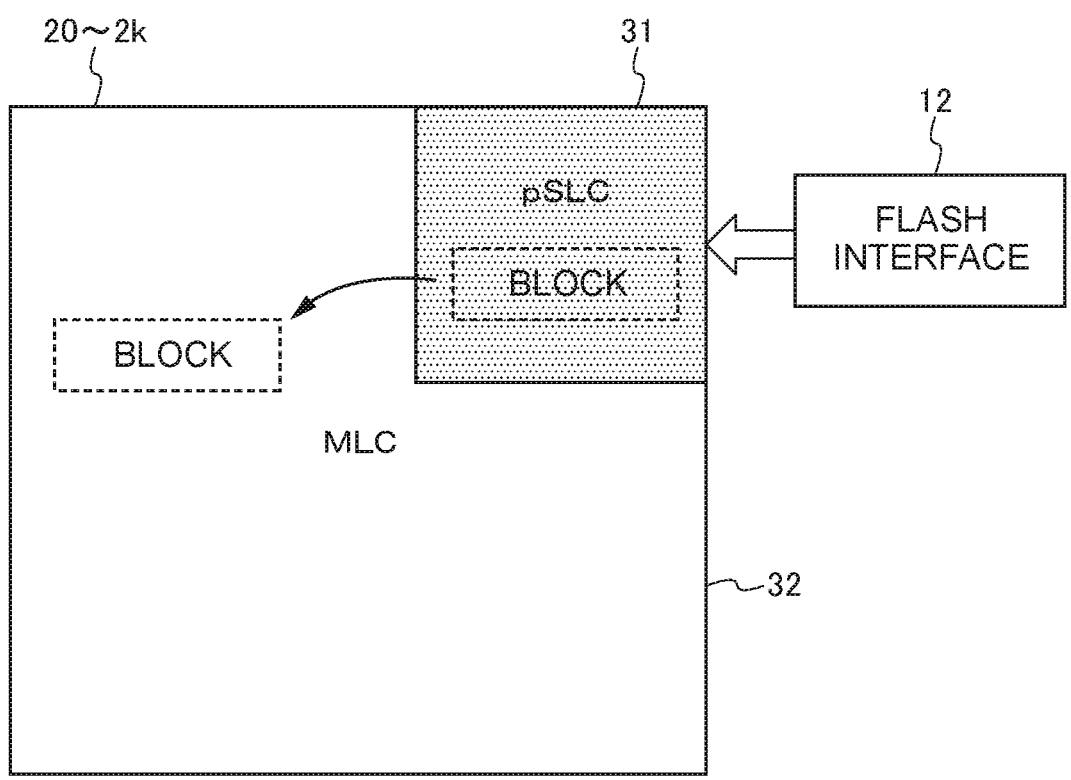
FIG. 2 is a schematic view for explaining the storage mode of the memory cells constituting the flash memories.

FIG. 2 is a schematic view for explaining the storage mode of the memory cells constituting the flash memories 20 to 2 k. The flash memories 20 to 2 k are each a non-volatile memory that erases data on a block basis and writes/reads data on a page basis. Each block is constituted of a plurality of pages.

As illustrated in FIG. 2, in the present embodiment, memory cells constituting the flash memories 20 to 2 k are each an MLC-type cell; however, some memory areas are used in a pseudo SLC (pSLC) mode, and other memory areas are used in an MLC mode as they are. In this example, it is assumed that a memory area 31 is used in the p-SLC mode, and a memory area 32 is used in the MLC mode. In which storage mode the memory cells are used is specified by a command supplied from the controller 10 to the flash memories 20 to 2 k. In the block used in the MLC mode, processing using write, read and erase commands for MLC mode is executed. On the other hand, in the block used in the SLC (pSLC) mode, write, read and erase commands for SLC (pSLC) mode are executed. When the storage mode of the block needs to be switched from the MLC mode to the SLC (pSLC) mode, erase processing using the erase command for MLC mode is executed, followed by execution of write processing using the write command for SLC (pSLC) mode. On the other hand, when the storage mode of the block needs to be switched from the SLC (pSLC) mode to the MLC mode, erase processing using the erase command for SLC (pSLC) mode is executed, followed by execution of write processing using the write command for MLC mode.

The pSLC mode memory area 31 is used as a buffer or a cache in flash memories 20 to 2 k. Thus, write data supplied from the flash interface 12 is not directly written in the MLC mode memory area 32 but once written in the pSLC mode memory area 31. When a predetermined block constituting the memory area 31 reaches a prescribed data size, data that has been written in the block is copied to the MLC mode memory area 32.

The reason why the memory area 31 is used as a buffer or a cache is that a readout error will easily occur when there is a data-unwritten page in the block used in the MLC mode. In other words, for the memory area 32 operating in the MLC mode, data should be written desirably on a block basis and, to realize this, the memory area 31 is used in the pSLC mode. However, the memory area 31 has higher rewriting frequency than the memory area 32 since it is used as a buffer or a cache. When the memory cell is used in the pSLC mode, the number of rewritable times is increased far greater than the case when the memory cell is used in the MLC mode; however, the pSLC mode memory area 31 may reach the end of its lifetime earlier depending on the rewriting frequency.

Taking this into consideration, in the present embodiment, the pSLC mode memory area 31 is not fixed, but the pSLC mode memory area 31 and MLC mode memory area 32 are replaced with each other accordingly. Hereinafter, the replacement processing will be described.

Figure 3:
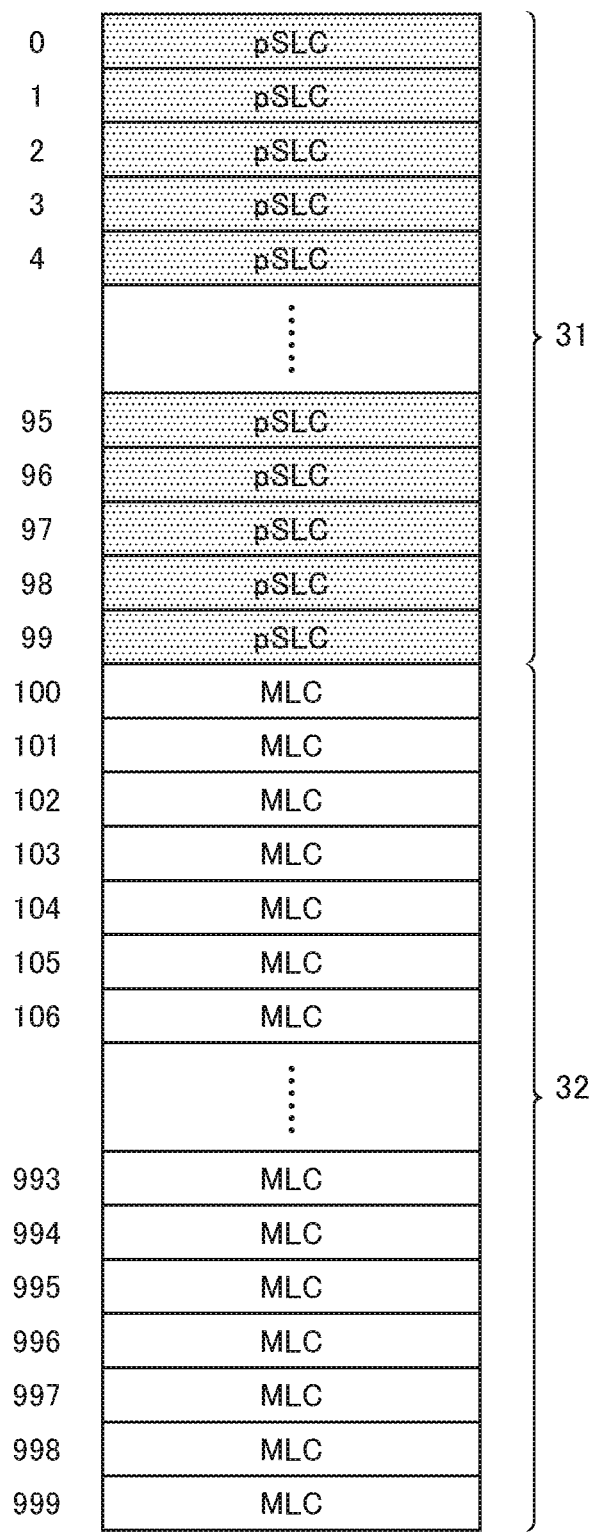
FIG. 3 is a schematic view illustrating blocks constituting the flash memory.

FIG. 3 is a schematic view illustrating blocks constituting the flash memory 20. The same processing is performed for the other flash memories 21 to 2 k, so hereinafter, description will be made focusing on processing for the flash memory 20.

In the example of FIG. 3, the flash memory 20 includes 1000 blocks (blocks 0 to 999). In the initial state, 100 blocks (blocks 0 to 99) constitute the pSLC mode memory area 31, and 900 blocks (blocks 100 to 999) constitute the MLC mode memory area 32. Thus, the MLC mode memory area 32 has a larger memory capacity than the pSLC mode memory area 31. In this example, the percentage of the pSLC mode memory cells is 10% of the total memory area.

The flash memory 20 further includes a management area 33. The management area 33 is a block for storing data in the storage mode management part 17 included in the memory controller 10. The storage mode of the block constituting the management area 33 may be either the pSLC mode or MLC mode. Further, any of the blocks 0 to 999 may be assigned to the management area 33.

Figure 4:
FIG. 4 is a table for explaining a first example of a data structure in the storage mode management part.

FIG. 4 is a table for explaining a first example of a data structure in the storage mode management part 17.

As illustrated in FIG. 4, the storage mode management part 17 stores therein control data 40 corresponding respectively to blocks 0 to 999. Each control data 40 is composed of a storage mode 41 of the corresponding block, a rewriting frequency 42 in the pSLC mode, and a rewriting frequency 43 in the MLC mode. FIG. 4 illustrate control data 40 in the initial state, and thus, the storage mode 41 corresponding to each of the blocks 0 to indicates the pSLC mode, and the storage mode 41 corresponding to each of the blocks 100 to 999 indicates the MLC mode. The rewriting frequencies 42 and 43 are all 0.

The operation is started from such an initial state, and every time an access is made to the flash memory 20 to perform data rewriting, the storage mode management part 17 increases the rewriting frequency 42 or 43 of the corresponding block. The blocks 0 to 99 used in the pSLC mode are used as a buffer or a cache, so that the value of the rewriting frequency 42 in each of them comparatively frequently increases. On the other hand, the value of the rewriting frequency 43 in each of the blocks 100 to 999 used in the MLC mode comparatively gently increases. FIG. 5 illustrates an example of the value of the rewriting frequency 42 or 43 in a state after a predetermined time has elapsed from the initial state. As illustrated in FIG. 5, in each of the blocks 0 to 99, the value of the rewriting frequency 42 in the pSLC mode increases, while the value of the rewriting frequency 43 in the MLC mode stays at 0. Conversely, in each of the blocks 100 to 999, the value of the rewriting frequency 43 in the MLC mode increases, while the value of the rewriting frequency 42 in the pSLC mode stays at 0.

When the value of the rewriting frequency 42 in the pSLC mode in a certain block reaches a predetermined value, the storage mode management part 17 switches the storage mode 41 of the block from the pSLC mode to the MLC mode and switches the storage mode 41 of another block operating in the MLC mode from the MLC mode to the pSLC mode.

Although there is no particular restriction on the value of the "predetermined value", it needs to be at least equal to or less than the number of rewritable times in the pSLC mode and is preferably sufficiently smaller (e.g., 1/100 of the number of rewritable times in the pSLC mode) than the number of rewritable times in the pSLC mode. A case where the above switching is made every time the value of the rewriting frequency 42 reaches 100 is taken as an example in the present embodiment.

FIGS. 6A to 6C are tables illustrating an example of a change in the value of the control data 40 in the storage mode management part 17. The tables 6A to 6C are arranged in the chronological order, and rewriting frequency increases with the lapse of time. FIGS. 7A to 7C are tables illustrating the storage mode of each of the blocks 0 to 999 constituting the flash memory 20, which correspond respectively to FIGS. 6A to 6C.

In the operation state of FIG. 6A, the value of the rewriting frequency 42 corresponding to each of the blocks 0, 96 and 97 reaches 100 and, accordingly, the storage mode 41 of each of the blocks 0, 96 and 97 is switched to the MLC mode. Further, in response to reduction in the number of blocks operating in the pSLC mode by three, the storage mode 41 of each of the blocks 100 to 102 is switched to the pSLC mode. Correspondingly, the storage mode in the flash memory 20 becomes as illustrated in FIG. 7A. Although there is no particular restriction on a selection method of the block whose storage mode is switched from the MLC mode to the pSLC mode, the blocks are selected in the ascending order of the block number in this example (besides, there are various selection methods available, such as in the descending or ascending order of rewriting frequency). A comparison between the operation state of FIG. 3 and the operation state of FIG. 6A reveals the following: in the operation state (a first operation state) of FIG. 3, the blocks 0, 96 and 97 are used in the pSLC mode, and blocks 100 to 102 are used in the MLC mode; while, in the operation state (a second operation state) of FIG. 6A, the blocks 0, 96 and 97 are used in the MLC mode, and blocks 100 to 102 are used in the pSLC mode.

In the operation state of FIG. 6B, the value of the rewriting frequency 42 corresponding to each of the blocks 2, 4, and 99 reaches 100 and, accordingly, the storage mode 41 of each of the blocks 2, 4 and 99 is switched to the MLC mode. Further, in response to reduction in the number of blocks operating in the pSLC mode by three, the storage mode 41 of each of the blocks 103 to 105 is switched to the pSLC mode. Correspondingly, the storage mode in the flash memory 20 becomes as illustrated in FIG. 7B. A comparison between the operation state of FIG. 6A and the operation state of FIG. 6B reveals the following: in the second operation state of FIG. 6A, the blocks 2, 4 and 99 are used in the pSLC mode, and blocks 103 to 105 are used in the MLC mode; while, in the operation state (a third operation state) of FIG. 6B, the blocks 2, 4, and 99 are used in the MLC mode, and blocks 103 to 105 are used in the pSLC mode.

In the operation state of FIG. 6C, the value of the rewriting frequency 42 corresponding to each of all the blocks 0 to 99 reaches 100 and, accordingly, the storage mode 41 of each of all the blocks 0 to 99 is switched to the MLC mode. Instead, the storage mode 41 of each of the blocks 100 to 199 is switched to the pSLC mode. Correspondingly, the storage mode in the flash memory 20 becomes as illustrated in FIG. 7C.

The above switching operation of the storage mode is sequentially executed until the last block 999 is switched to the pSLC mode. After the block 999 is switched to the pSLC mode, the switching operation is repeated from the head block 0, and the blocks 1, 2 and 3 are sequentially switched to the pSLC mode in this order. In the present embodiment, the blocks to be used in the pSLC mode are replaced accordingly by repeatedly executing the above operation. The value of the rewriting frequency 42 may be reset every time it reaches a predetermined value (in this example, 100) or may be continuously counted. In the former case, every time the value of the rewriting frequency 42 reaches 100, the storage mode 41 only needs to be switched from the pSLC mode to the MLC mode. In this case, the control data 40 can be reduced in data amount. In the latter case, every time the last two digits of the value of the rewriting frequency 42 indicate "00", the storage mode 41 is switched from the pSLC mode to the MLC mode. In this case, cumulative rewriting frequency in the pSLC mode can be stored.

When the system is terminated, the current control data 40 stored in the storage mode management part 17 is written in the management area 33 of the flash memory 20. This allows the current control data 40 to be stored in a non-volatile manner. Then, at the next power-on, the control data 40 stored in the management area 33 of the flash memory 20 is read out and loaded into the storage mode management part 17. This allows the control data 40 to be properly taken over.

As described above, in the flash memory system according to the present embodiment, the blocks operating in the pSLC mode are sequentially replaced, so that even when the block used in the pSLC mode is used as a buffer or a cache, the rewriting frequency will by no means deviated. Thus, the rewriting frequency can be leveled among the blocks, making it possible to make maximum use of the total lifetime of the flash memories 20 to 2 k.

In addition, in the present embodiment, the switching between the pSLC mode and the MLC mode is performed on a block basis, the rewriting frequency in the pSLC mode hardly varies among the blocks, thus making it possible to minimize lifetime deterioration of the flash memory system caused due to a variation in the rewriting frequency.

However, in the present invention, the switching between the pSLC mode and the MLC mode need not necessarily be performed on a block basis, but may be performed in units of multiple blocks. The following describes an example in which the switching between the pSLC mode and MLC mode is performed in units of multiple blocks.

Figure 8:
FIG. 8 is a table for explaining a second example of a data structure in the storage mode management part.

FIG. 8 is a table for explaining a second example of a data structure in the storage mode management part 17.

Figure 9:
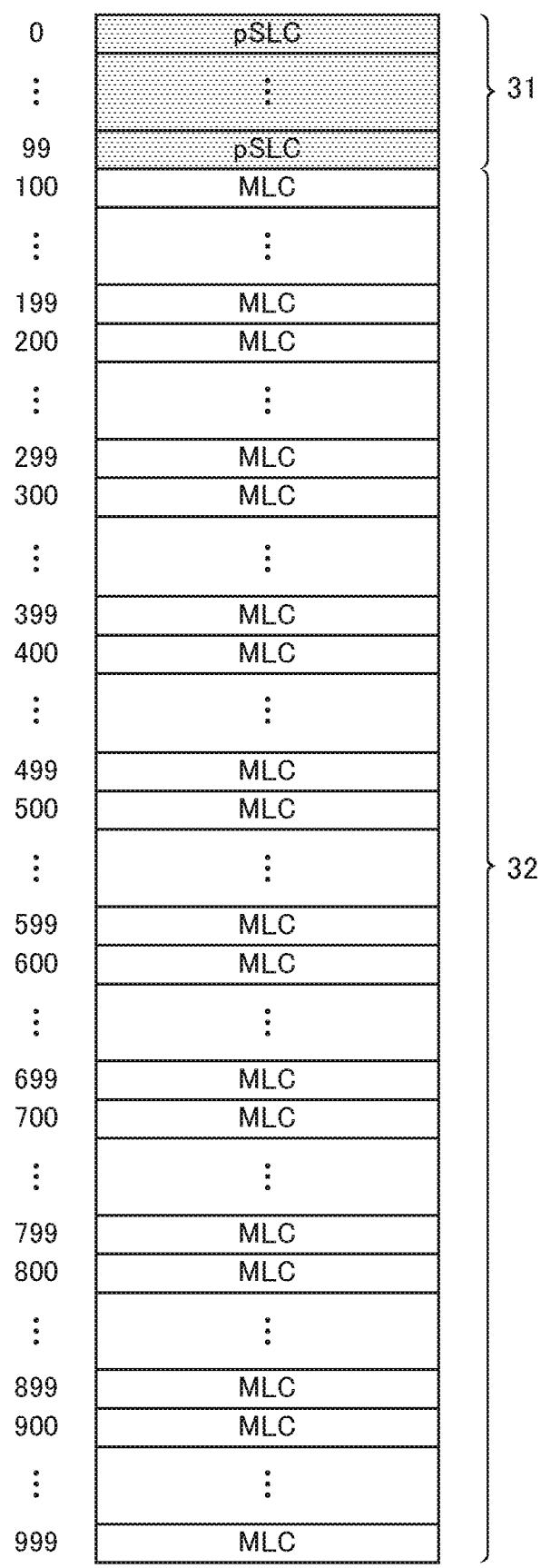
FIG. 9 is a schematic view illustrating blocks constituting the flash memory in a first operation state.

In the example of FIG. 8, the blocks 0 to 999 in the flash memory 20 are grouped into 10 groups, and the rewriting frequency is counted for each group. In FIG. 8, control data 40 in the initial state is illustrated, and thus, the storage mode 41 of the group corresponding to the blocks 0 to 99 indicates the pSLC mode, and the storage mode 41 of the other groups indicates the MLC mode. The rewriting frequencies 42 and 43 are all 0. In this state, as illustrated in FIG. 9, the blocks 0 to 99 operate in the pSLC mode, and the blocks 100 to 999 operate in the MLC mode.

Figure 11:
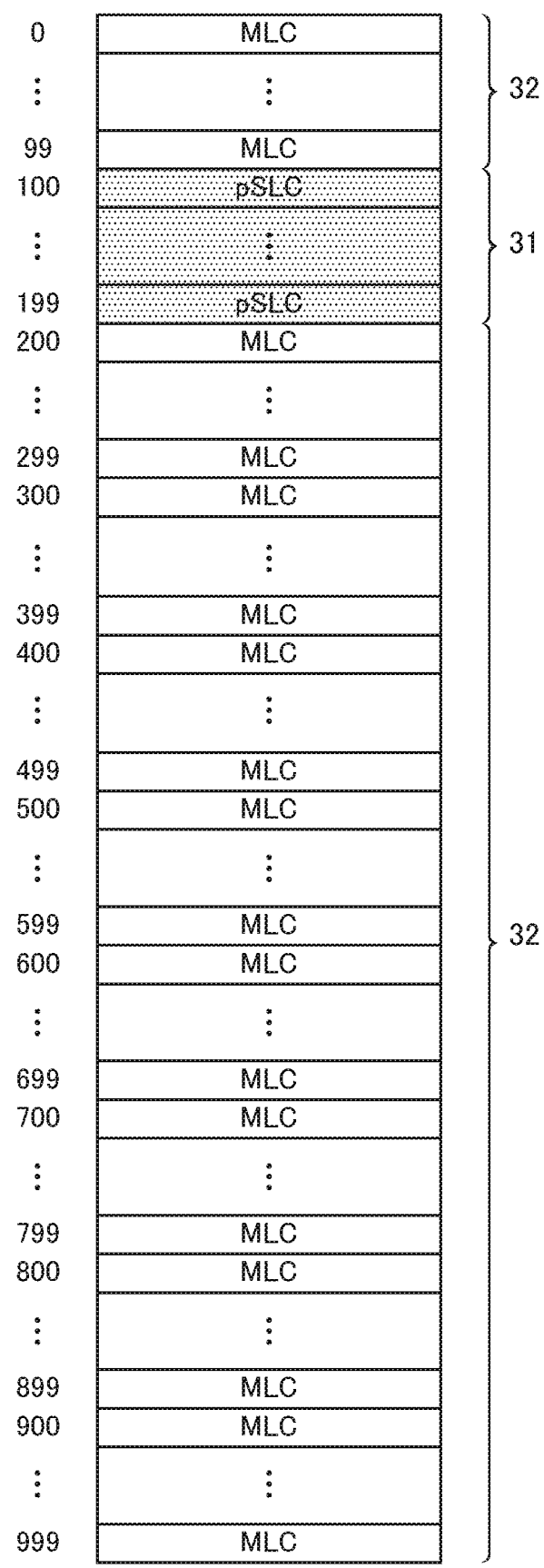
FIG. 11 is a schematic view illustrating blocks constituting the flash memory in a second operation state.

The operation is started from such an initial state, and every time an access is made to the flash memory 20 to perform data rewriting, the storage mode management part 17 increases the rewriting frequency 42 or 43 of the corresponding group. The storage mode management part 17 does not make distinction among the blocks in each group. Then, as illustrated in FIG. 10, when the value of the rewriting frequency 42 of the group corresponding to the blocks 0 to 99 reaches a predetermined value (in the present example, 10000), the storage mode management part 17 switches the storage mode 41 of this group from the pSLC mode to the MLC mode and switches the storage mode 41 of the next group from the MLC mode to the pSLC mode. The next group refers to the group corresponding to the blocks 100 to 199. Thus, as illustrated in FIG. 11, the blocks 0 to 99, blocks 200 to 999 operate in the MLC mode, and the blocks 100 to 199 operate in the pSLC mode.

Figure 13:
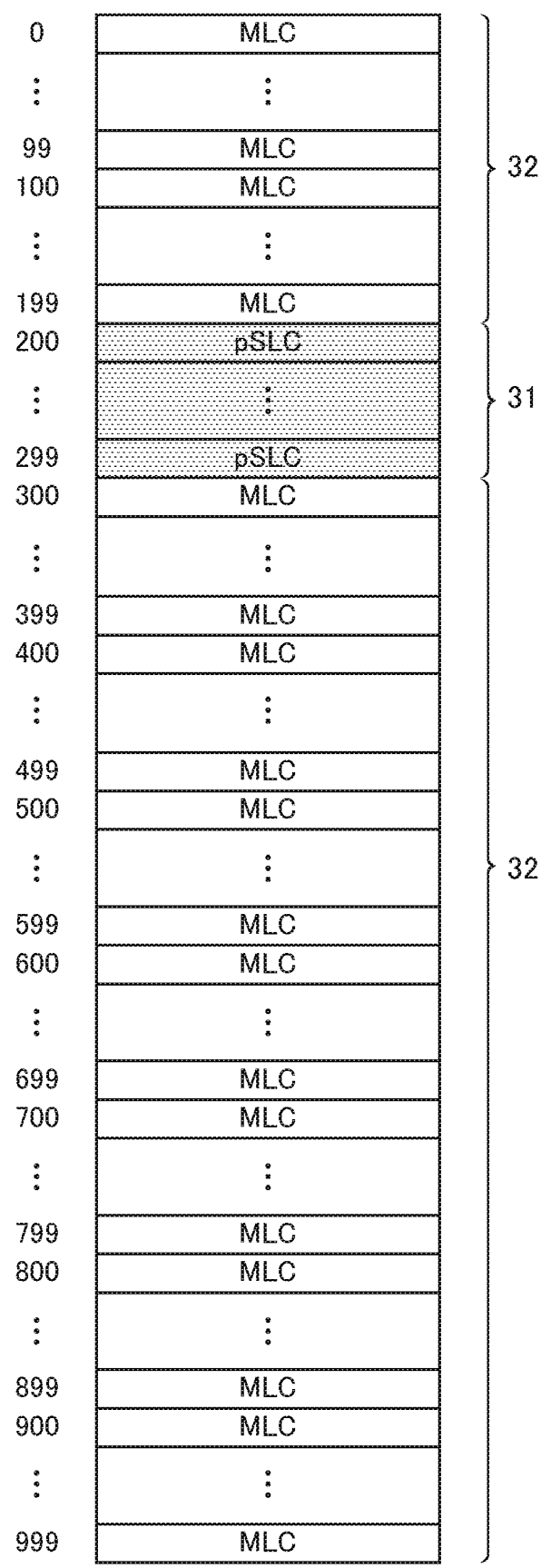
FIG. 13 is a schematic view illustrating blocks constituting the flash memory in a third operation state.

When an access to the flash memory 20 is repeatedly executed to make the value of the rewriting frequency 42 of the group corresponding to the blocks 100 to 199 reach a predetermined value (in the present example, 10000) as shown in FIG. 12, the storage mode management part 17 switches the storage mode 41 of this group from the pSLC mode to the MLC mode and switches the storage mode 41 of the next group from the MLC mode to the pSLC mode. The next group refers to the group corresponding to the blocks 200 to 299. Thus, as illustrated in FIG. 13 FIGS. 12 and 13, the blocks 0 to 199 and blocks 300 to 999 operate in the MLC mode, and the blocks 200 to 299 operate in the pSLC mode.

FIGS. 14A to 14C and FIGS. 15A to 15C are schematic views each illustrating the rewriting frequency for each group, in which a shaded arrow 51 indicates the rewriting frequency in the pSLC mode by its length, and a white arrow 52 indicates the rewriting frequency in the MLC mode by its length.

Figure 14A:
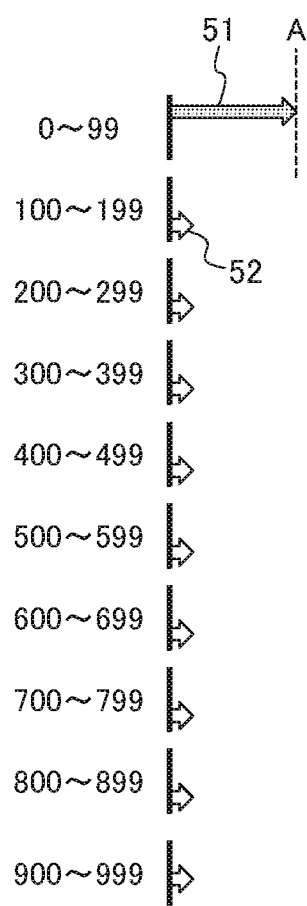
FIGS. 14A to 14C and FIGS. 15A to 15C are schematic views each illustrating the rewriting frequency for each group.
Figure 14B:
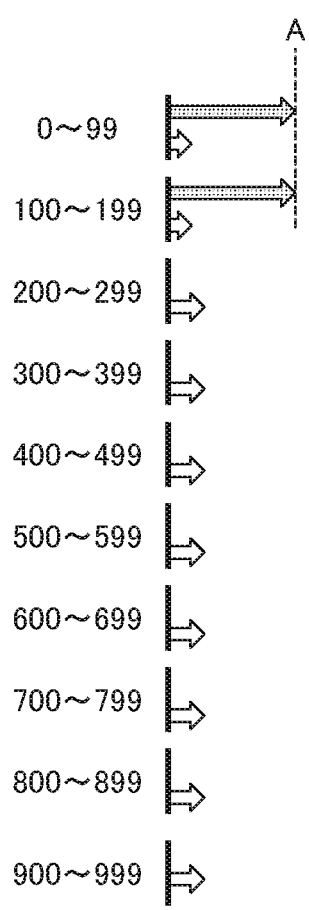
Figure 14C:
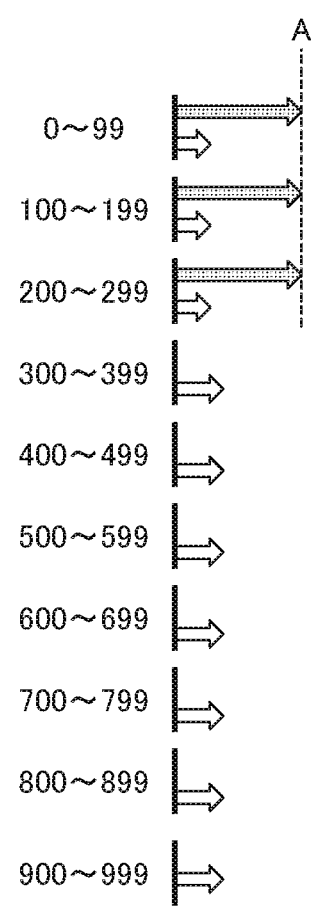

FIG. 14A illustrates a state described using FIGS. 8 and 9, that is, a state where the blocks 0 to 99 operate in the pSLC mode. When the total rewriting frequency of the blocks 0 to 99 in the pSLC mode reaches a predetermined value A, the state illustrated in FIG. 14A shifts to the state illustrated in FIG. 14B. FIG. 14B illustrates a state described using FIGS. 10 and 11, that is, a state where the blocks 100 to 199 operate in the pSLC mode. When the total rewriting frequency of the blocks 100 to 199 in the pSLC mode reaches the predetermined value A, the state illustrated in FIG. 14B shifts to the state illustrated in FIG. 14C. FIG. 14C illustrates a state described using FIGS. 12 and 13, that is, the blocks 200 to 299 operate in the pSLC mode.

Figure 15A:
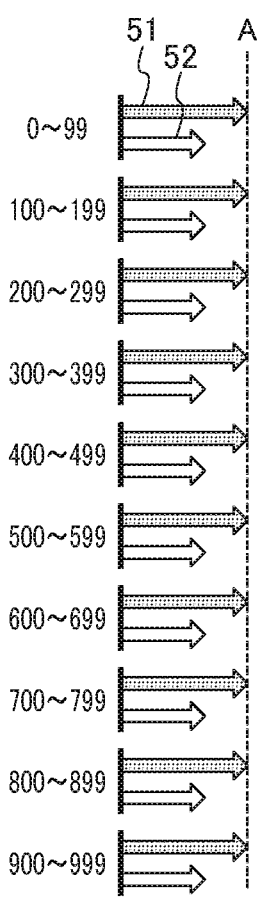
Figure 15B:
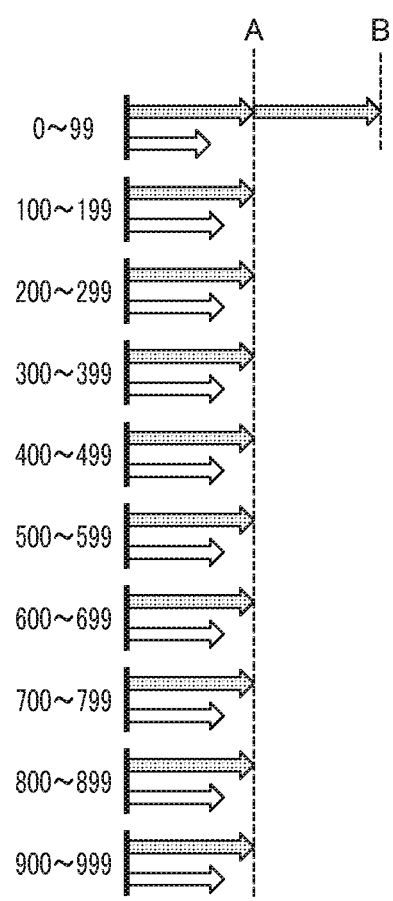
Figure 15C:
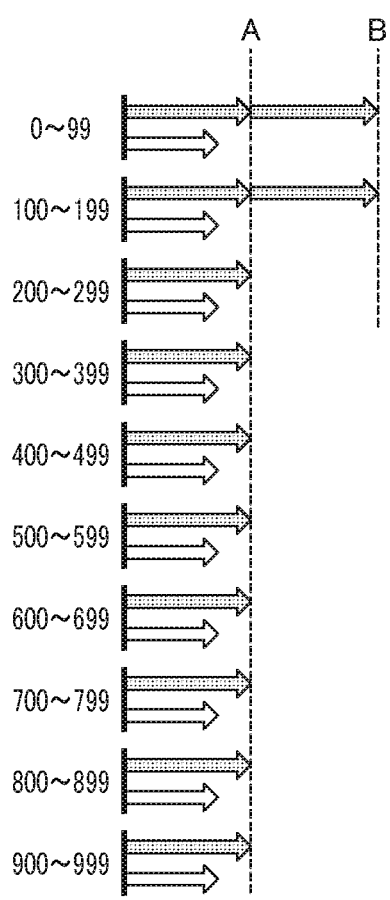

After sequential execution of the above operation, a state illustrated in FIG. 15A where the blocks 900 to 999 operate in the pSLC mode is reached. When the total rewriting frequency of the blocks 900 to 999 in the pSLC mode reaches the predetermined value A, the blocks 0 to 99 are switched from the MLC mode to the pSLC mode as illustrated in FIG. 15B. Afterward, the same operation as above is repeated, that is, when the total rewriting frequency of the blocks 0 to 99 in the pSLC mode reaches a predetermined value B, the state illustrated in FIG. 15B shifts to the state illustrated in FIG. 15C. In this example, the predetermined value B is twice as large as the predetermined value A, but not limited thereto.

As described above, when the switching between the pSLC mode and the MLC mode is performed in units of multiple blocks, it is possible to allow the storage mode management part 17 to simply the management of the rewriting frequency and to reduce the amount of the control data 40.

It is apparent that the present invention is not limited to the above embodiments, but may be modified and changed without departing from the scope and spirit of the invention.

For example, although part of the memory area of the flash memory constituted of MLC-type memory cells is used in the pSLC mode in the above embodiment, the present invention is not limited to this. Thus, the present invention may be applied to a system in which part of the memory area of a flash memory constituted of TLC-type memory cells is used in the pSLC mode and a system in which part of the memory area of a flash memory constituted of TLC-type memory cells is used in the pMLC mode. Thus, the present invention can be applied to all cases where a flash memory capable of storing information of n bits or more in one cell is used in a storage mode in which information of less than n bits is stored in one cell only in part of the memory area of the flash memory.

Further, although the storage mode of the block is switched based on the rewriting frequency in the above embodiment, the present invention is not limited to this, but the storage mode may be switched according to a condition other than the rewriting frequency. For example, the storage mode may be switched every fixed period of time, irrespective of the rewriting frequency.

What is claimed is:

1. A memory controller controlling data transfer between a host system and a flash memory, the flash memory having first, second, and third memory areas each including a plurality of cells, each of the first, second, and third memory areas being configured to operate in one of a plurality of storage modes including a first storage mode in which each of the cells stores information of less than n bits (n is greater than 1) and a second storage mode in which each of the cells stores information of the n bits,
   wherein the memory controller is configured to operate on one of a plurality of operation states including first second, and third operation states,
   wherein, in the first operation state, the first memory area is used in the first storage mode, and the second and third memory areas are used in the second storage,
   wherein, in the second operation state, the first and third memory areas are used in the second storage mode, and the second memory area is used in the first storage mode,
   wherein, in the third operation state, the first and second memory areas are used in the second storage mode, and the third memory area is used in the first storage mode,
   wherein the memory controller shifts from the first operation state to the second operation state when a frequency of rewriting operation with respect to the first memory area satisfies a first predetermined condition, and
   wherein the memory controller shifts from the second operation state to the third operation state when a frequency of rewriting operation with respect to the second memory area satisfies a second predetermined condition.

2. The memory controller as claimed in claim 1, wherein the memory controller shifts to the first operation state again when a third predetermined condition is satisfied after the operation state of the memory controller shifts from the first operation state to another operation state including the second and third operation states.

3. The memory controller as claimed in claim 1, wherein each of the first and second memory areas includes a single block.

4. The memory controller as claimed in claim 1, wherein each of the first and second memory areas includes a plurality of blocks.

5. A flash memory system comprising:
   a flash memory; and
   a memory controller controlling data transfer between a host system and the flash memory,
   wherein the flash memory has first, second, and third memory areas each including a plurality of cells, each of the first, second, and third memory areas being configured to operate in one of a plurality of storage modes including a first storage mode in which each of the cells stores information of less than n bits (n is greater than 1) and a second storage mode in which each of the cells stores information of the n bits,
   wherein the memory controller is configured to operate on one of a plurality of operation states including first second, and third operation states,
   wherein, in the first operation state, the first memory area is used in the first storage mode, and the second and third memory areas are used in the second storage mode,
   wherein, in the second operation state, the first and third memory areas are used in the second storage mode, and the second memory area is used in the first storage mode,
   wherein, in the third operation state, the first and second memory areas are used in the second storage mode, and the third memory area is used in the first storage mode,
   wherein the memory controller shifts from the first operation state to the second operation state when a frequency of rewriting operation with respect to the first memory area satisfies a first predetermined condition, and
   wherein the memory controller shifts from the second operation state to the third operation state when a frequency of rewriting operation with respect to the second memory area satisfies a second predetermined condition.

* * * * *